(12) United States Patent
Agarwal et al.

(10) Patent No.: US 12,334,869 B2
(45) Date of Patent: Jun. 17, 2025

(54) ENABLING AN EXTERNAL RESISTOR FOR AN OSCILLATOR

(71) Applicant: TEXAS INSTRUMENTS INCORPORATED, Dallas, TX (US)

(72) Inventors: Nitin Agarwal, Bangalore (IN); Aniruddha Roy, Bangalore (IN); Preetham Narayana Reddy, Bangalore (IN)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 18/542,861

(22) Filed: Dec. 18, 2023

(65) Prior Publication Data

US 2024/0120882 A1 Apr. 11, 2024

Related U.S. Application Data

(63) Continuation of application No. 17/509,706, filed on Oct. 25, 2021, now Pat. No. 11,848,645.

(51) Int. Cl.
   *H03K 3/0231* (2006.01)
   *H03B 5/20* (2006.01)
   *H03B 5/24* (2006.01)

(52) U.S. Cl.
   CPC ............... *H03B 5/20* (2013.01); *H03B 5/24* (2013.01); *H03K 3/0231* (2013.01);
   (Continued)

(58) Field of Classification Search
   CPC .... H03B 5/20; H03B 5/24; H03B 2200/0014; H03B 2200/0034; H03B 2200/0038; H03K 3/0231
   See application file for complete search history.

(56) References Cited

U.S. PATENT DOCUMENTS 5,552,748 A * 9/1996 O'Shaughnessy ........ H03L 7/00
                                                   331/111
5,699,024 A * 12/1997 Manlove ................. H03L 1/022
                                                   331/113 R
(Continued)

OTHER PUBLICATIONS

Non-Final Office Action mailed Nov. 4, 2022, U.S. Appl. No. 17/509,836, filed Oct. 25, 2021, 8 pages.
(Continued)

*Primary Examiner* — Levi Gannon
(74) *Attorney, Agent, or Firm* — Brian D. Graham; Frank D. Cimino (57) ABSTRACT

In an example, a system includes an oscillator circuit on a chip. The oscillator circuit includes a charging current generator including a current mirror, an amplifier, and an on-chip resistor, where the on-chip resistor is coupled to a pin on the chip. The oscillator circuit also includes oscillator circuitry coupled to the charging current generator, where the oscillator circuitry includes a comparator, a phase generator, a first capacitor coupled to a first resistor, and a second capacitor coupled to a second resistor. The system also includes an external resistor coupled to the pin, where the external resistor is external to the chip. The system includes an external capacitor coupled to the pin, where the external capacitor is external to the chip.

20 Claims, 8 Drawing Sheets

(52) U.S. Cl.
CPC ............... *H03B 2200/0014* (2013.01); *H03B 2200/0034* (2013.01); *H03B 2200/0038* (2013.01)

(56) References Cited

U.S. PATENT DOCUMENTS

| | | | |
|---|---|---|---|
| 6,020,792 | A | 2/2000 | Nolan |
| 7,034,627 | B1 | 4/2006 | Kudari |
| 7,332,944 | B2 | 2/2008 | Fujita |
| 9,520,881 | B1 | 12/2016 | Das |
| 9,660,628 | B2 * | 5/2017 | Almazan ............. H03K 5/1534 |
| 10,666,235 | B1 | 5/2020 | Chou |
| 11,329,606 | B1 | 5/2022 | Cao |
| 11,437,955 | B1 | 9/2022 | Agarwal |
| 2006/0097813 | A1 | 5/2006 | Won |
| 2006/0126238 | A1 | 6/2006 | Goudo |
| 2007/0146087 | A1 | 6/2007 | Hwang |
| 2007/0233912 | A1 | 10/2007 | Piasecki |
| 2008/0136492 | A1 | 6/2008 | Hu |
| 2008/0180151 | A1 | 7/2008 | Gong |
| 2013/0154753 | A1 * | 6/2013 | Huang ................. H03K 3/0231 331/176 |
| 2014/0062610 | A1 | 3/2014 | Ito |
| 2015/0214934 | A1 | 7/2015 | Luan |
| 2016/0254817 | A1 | 9/2016 | Vahid Far |
| 2017/0104475 | A1 | 4/2017 | Lam |
| 2017/0177020 | A1 * | 6/2017 | Mukherji ................. H03B 1/00 |
| 2017/0279454 | A1 * | 9/2017 | Li ......................... H03L 7/0891 |
| 2019/0013779 | A1 | 1/2019 | Jin |
| 2019/0149140 | A1 | 5/2019 | Han |
| 2019/0319611 | A1 | 10/2019 | Sim |
| 2020/0014372 | A1 | 1/2020 | Narwal |
| 2020/0091897 | A1 | 3/2020 | Zou |

OTHER PUBLICATIONS

Notice of Allowance mailed May 22, 2023, U.S. Appl. No. 17/509,836, filed Oct. 25, 2021, 7 pages.

Notice of Allowance mailed Apr. 21, 2022, U.S. Appl. No. 17/510,032, filed Oct. 25, 2021, 9 pages.

* cited by examiner

ENABLING AN EXTERNAL RESISTOR FOR AN OSCILLATOR

CROSS-REFERENCE TO RELATED APPLICATIONS

The present application is a continuation of U.S. patent application Ser. No. 17/509,706, filed Oct. 25, 2021, which claims priority to India Provisional Patent Application No. 202141018551, filed Apr. 22, 2021, each of which is incorporated by reference herein in its entirety.

The present application is related in subject matter to U.S. patent application Ser. No. 17/509,836, filed Oct. 25, 2021, now U.S. Pat. No. 11,796,606, which claims priority to India Provisional Patent Application No. 202141018273, filed Apr. 20, 2021. The present application is also related in subject matter to U.S. patent application Ser. No. 17/510,032, filed Oct. 25, 2021, now U.S. Pat. No. 11,437,955, which claims priority to India Provisional Patent Application No. 202141035219, filed Aug. 5, 2021.

BACKGROUND

Oscillators generate clock signals for microcontrollers and other electronic devices. Oscillators produce a repeating and alternating waveform that may be used for a variety of applications. Oscillators may be located within an electronic chip, with some components on-chip and some components off-chip. The accuracy of the oscillator may vary based on the structure of the oscillator and the components that make up the oscillator.

SUMMARY

In accordance with at least one example of the disclosure, a system includes an oscillator circuit on a chip. The oscillator circuit includes a charging current generator including a current mirror, an amplifier, and an on-chip resistor, where the on-chip resistor is coupled to the amplifier and to a pin on the chip. The oscillator circuit also includes oscillator circuitry coupled to the charging current generator, where the oscillator circuitry includes a comparator, a phase generator, a first capacitor coupled to a first resistor, and a second capacitor coupled to a second resistor.

In accordance with at least one example of the disclosure, a system includes an oscillator circuit on a chip. The oscillator circuit includes a charging current generator including a current mirror, an amplifier, and an on-chip resistor, where the on-chip resistor is coupled to a pin on the chip. The oscillator circuit also includes oscillator circuitry coupled to the charging current generator, where the oscillator circuitry includes a comparator, a phase generator, a first capacitor coupled to a first resistor, and a second capacitor coupled to a second resistor. The system also includes an external resistor coupled to the pin, where the external resistor is external to the chip. The system includes an external capacitor coupled to the pin, where the external capacitor is external to the chip.

In accordance with at least one example of the disclosure, a method includes coupling a pin of an oscillator chip to an internal resistor and to an external resistor. The method also includes generating a current for an oscillator, where the current is generated with an amplifier coupled to the internal resistor and coupled to a current mirror. The method includes charging a first capacitor with the current to produce a first voltage. The method also includes, responsive to the first voltage reaching a predetermined value, activating a switch to charge a second capacitor with the current to produce a second voltage. The method includes, responsive to the second voltage reaching the predetermined value, activating the switch to charge the first capacitor.

BRIEF DESCRIPTION OF THE DRAWINGS

The same reference numbers or other reference designators are used in the drawings to designate the same or similar (functionally and/or structurally) features.

DETAILED DESCRIPTION

Some oscillators may be produced that have circuit components located within an electronic chip (on-chip), while other oscillators have some circuit components located off the chip (off-chip). In examples herein, "off-chip" is synonymous with the term "external." Also, "on-chip" is synonymous with the term "internal." If an oscillator chip has on-chip resistor components, the resistor components may have a temperature-dependent non-linear variation. The resistor values may also drift over time. Due to these variations and other factors, an oscillator chip with on-chip resistor components may not be able to achieve accuracy of its frequency within 1% of a target frequency. An external resistor, coupled to the oscillator chip, may provide greater accuracy than an internal resistor but may have other drawbacks.

The error in the oscillator's frequency is proportional to the error in the resistor, whether an internal resistor or an external resistor. Therefore, a more accurate resistor provides a more accurate oscillator. If the oscillator uses an external resistor, the external resistor is connected to one of the pins of the oscillator chip. Because the resistor is external, it is subject to noise or coupling from sources outside the oscillator chip. This noise may cause frequency error or jitter because it causes the external resistance to fluctuate. To reduce this noise, a capacitor in parallel with the external resistor may be provided. The capacitor, however, may cause stability problems for the internal circuitry of the oscillator that is coupled to the capacitor via the pin.

In examples herein, an external resistor is coupled to a pin of the oscillator chip to provide increased accuracy of the oscillator frequency. Also, a first internal resistor (e.g., on-chip) is coupled to the external resistor and to an external capacitor to provide stability. The first internal resistor may be subject to process or other variations, which may affect the frequency of the oscillator. Therefore, additional internal resistors are added to the oscillator circuitry to compensate for the effect of the first internal resistor coupled to the external resistor. The additional internal resistors may be sized appropriately to compensate for the first internal resistor. Also, in some examples, various oscillator components may be trimmed to correct for frequency errors across temperature and process variations. Reference voltages, internal resistor values, capacitor values, and/or current mirrors may be trimmed in various examples herein to correct for frequency errors.

Figure 1:
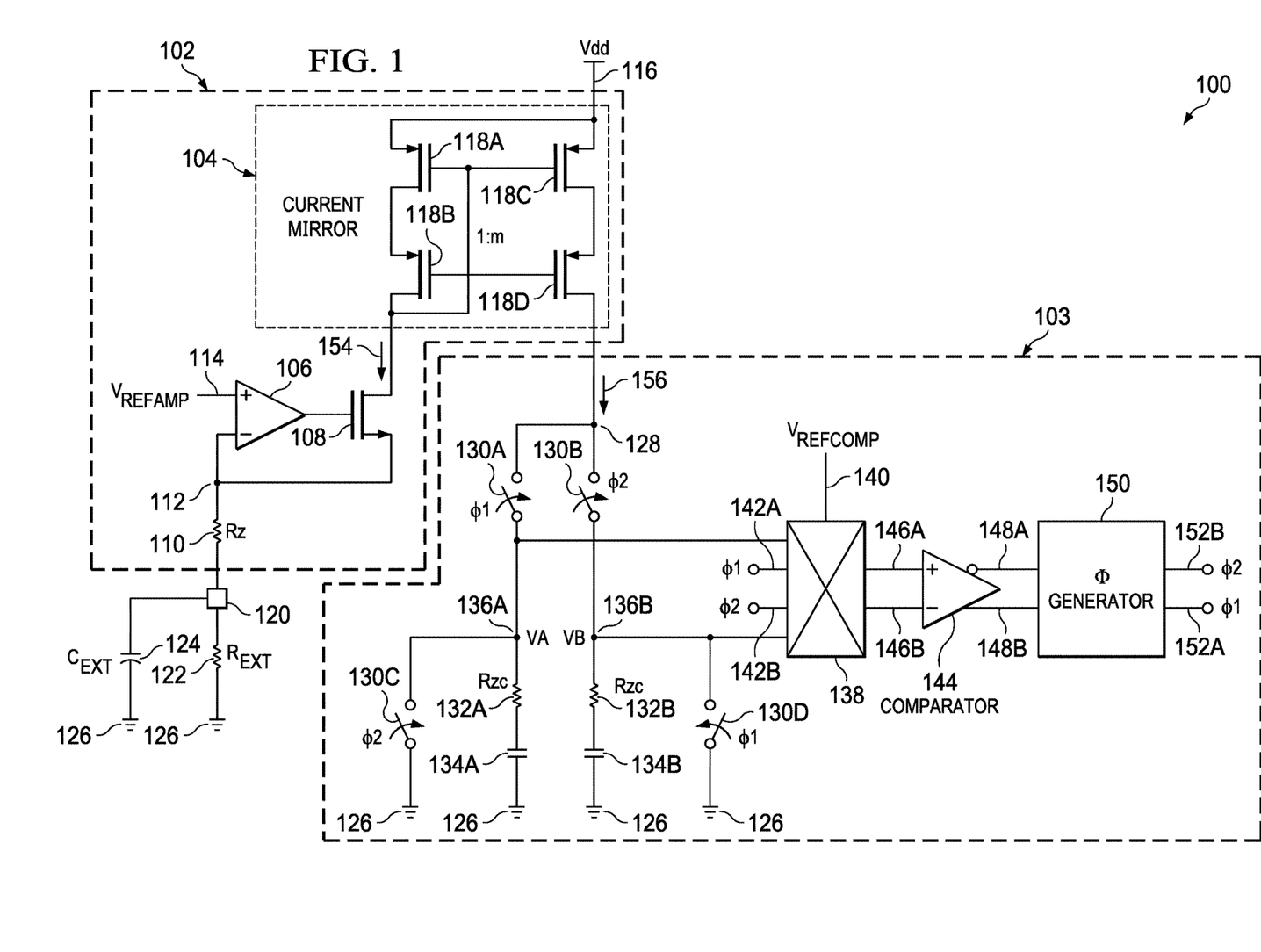
FIG. 1 is a circuit diagram of a system for an oscillator with external resistor in accordance with various examples.

FIG. 1 is a circuit diagram of a system 100 having an oscillator with an external resistor in accordance with various examples herein. System 100 includes a charging current generator 102 that generates charging current used by oscillator circuitry 103. Charging current generator 102 includes a current mirror 104, an amplifier 106, a transistor 108, an on-chip resistor $R_Z$ 110, node 112, and reference voltage node $V_{REFAMP}$ 114. Current mirror 104 is coupled to voltage node 116 and includes transistors 118A, 118B, 118C, and 118D (collectively, transistors 118). On-chip resistor $R_Z$ 110 may be referred to herein as an internal resistor, as it is internal to the oscillator chip. Oscillator circuitry 103 includes the components shown within the dashed box in this example. In some examples, other components may be included within oscillator circuitry 103. In other examples, some of the components shown within oscillator circuitry 103 may be outside of oscillator circuitry 103. In some examples herein, components within charging current generator 102 and oscillator circuitry 103 may be located inside an oscillator chip, while other components are external to the chip.

System 100 includes node 120, which is a pin of an oscillator chip that is configured to couple to external components. In this example, node 120 is coupled to external resistor $R_{EXT}$ 122 and external capacitor $C_{EXT}$ 124. External resistor $R_{EXT}$ 122 and external capacitor $C_{EXT}$ 124 are coupled to ground 126.

System 100 also includes node 128, switches 130A, 130B, 130C, and 130D (collectively, switches 130), resistors $R_{ZC}$ 132A and $R_{ZC}$ 132B (collectively, resistors 132), and capacitors 134A and 134B (collectively, capacitors 134). System 100 includes node VA 136A and node VB 136B, block 138, input node 140 (coupled to a voltage source that provides a voltage $V_{REFCOMP}$), input nodes 142A and 142B, and comparator 144. Comparator 144 includes first input 146A and second input 146B. Comparator 144 includes first output 148A and second output 148B. System 100 also includes phase generator 150, which has a first output 152A and a second output 152B. System 100 includes currents 154 and 156.

Charging current generator 102 provides a charging current to circuitry in system 100 that produces an oscillating waveform. As described above, an external resistor (such as external resistor $R_{EXT}$ 122) is located outside of the chip and is useful for providing an accurate oscillator. The external resistor R EXT 122 is coupled to node 120, which is a pin of the chip. The external capacitor $C_{EXT}$ 124 is coupled in parallel to external resistor $R_{EXT}$ 122, and is configured to provide filtering for noise that occurs at node 120. The external capacitor $C_{EXT}$ 124 may cause stability problems for the internal circuitry coupled to node 120, however. Those stability problems are addressed with on-chip resistor $R_Z$ 110 as described below.

In operation, charging current generator 102 provides a charging current 156 to circuitry that produces an oscillating waveform. Amplifier 106 has a first input coupled to reference voltage node $V_{REFAMP}$ 114 and a second input coupled to node 112. Node 112 is coupled to on-chip resistor $R_Z$ 110 and to a source of transistor 108. A gate of transistor 108 is coupled to the output of amplifier 106. Amplifier 106 ensures a reference voltage $V_{REFAMP}$ is divided by on-chip resistor $R_Z$ 110 plus external resistor $R_{EXT}$ 122, which produces a current 154 through transistor 108. A drain of transistor 108 is coupled to current mirror 104. Current mirror 104 mirrors current 154 to produce current 156, which is a charging current for the oscillator circuitry 103. The current mirror 104 may have a ratio of 1:m, so current 156 is m times as large as current 154. Any number of transistors 118 may be included in current mirror 104 to produce a specific value of m.

Switches 130 are labeled either Φ1 or Φ2 indicating their switching behavior. In this example, switches 130A and 130D are Φ1, while switches 130B and 130C are Φ2. The Φ1 switches 130A and 130D alternate opening and closing with the Φ2 switches 130B and 130C. The switches 130 are configured to charge and discharge the capacitors 134 to produce an oscillating waveform. The opening and closing of the switches 130 produces voltages at nodes VA 136A and VB 136B. A first terminal of resistor $R_{ZC}$ 132A is coupled to capacitor 134A, and a second terminal of resistor $R_{ZC}$ 132A is coupled to node VA 136A, which is coupled to block 138. A first terminal of resistor $R_{ZC}$ 132B is coupled to capacitor 134B, and a second terminal of resistor $R_{ZC}$ 132B is coupled to node VB 136B, which is coupled to block 138.

For example, if switches 130B and 130C are closed while switches 130A and 130D are open, node VA 136A is shorted to ground 126 via switch 130C. Current 156 flows through switch 130B and charges capacitor 134B. Therefore, a first voltage at node VB 136B begins to ramp up. The first voltage at node VB 136B ramps up until it reaches the predetermined value of voltage $V_{REFCOMP}$ at input node 140 of block 138. Block 138 provides the inputs ($V_{REFCOMP}$, VA, VB) to comparator 144 on first input 146A and second input 146B. Block 138 selects which inputs ($V_{REFCOMP}$, VA, VB) to provide to comparator 144. In this example, block 138 provides the predetermined value of voltage $V_{REFCOMP}$ to first input 146A and the first voltage at node VB 136B to second input 146B. When the first voltage at node VB 136B reaches $V_{REFCOMP}$, comparator 144 toggles its outputs 148A and 148B, and the phases Φ1 and Φ2 reverse their polarity via phase generator 150. Toggling these outputs 148A and 148B activates the switches 130. For example, switches 130B and 130C open, and switches 130A and 130D close responsive to the toggling. After the toggling, the first voltage at node VB 136B is shorted to ground 126 via closed switch 130D. Node VA 136A is coupled to current mirror 104 via closed switch 130A, and current 156 begins charging capacitor 134A through resistor $R_{ZC}$ 132A. A second voltage at node VA 136A begins to ramp up via the charging of capacitor 134A, and the process repeats. The second voltage ramps up until it reaches $V_{REFCOMP}$, at which time comparator 144 toggles its outputs 148A and 148B again. This repeating process provides an oscillating clock signal.

For an external resistor oscillator without on-chip resistor $R_Z$ 110, the frequency of the oscillator is given by Equation (1):

$$f=(V_{REFAMP}/V_{REFCOMP}) \times m1(2R_{EXT}C) \qquad (1)$$

where m is the current mirror ratio, $R_{EXT}$ is the value of external resistor $R_{EXT}$ 122, and C is the value of capacitor 134A or 134B. As described above, the external capacitor $C_{EXT}$ 124 is added to filter noise on the pin of node 120. However, external capacitor $C_{EXT}$ 124 may provide stability problems for the circuitry coupled to node 120. Therefore, an on-chip resistor $R_Z$ 110 is added to provide a zero to the loop gain transfer function and to stabilize the loop. With on-chip resistor $R_Z$ 110 included, the frequency of the oscillator is given by Equation (2):

$$f=(V_{REFAMP}/V_{REFCOMP}) \times m/[2(R_{EXT}+R_Z)C] \quad (2)$$

While addressing the stability issues, the added resistor $R_Z$ 110 may increase frequency variability. As seen in Equation (1), any error in the value of the external resistor $R_{EXT}$ 122 proportionally causes an error in the frequency based on the equation. When the on-chip resistor $R_Z$ 110 is added to the circuit, the frequency then becomes proportional to the external resistor $R_{EXT}$ 122 plus on-chip resistor $R_Z$ 110. On-chip resistors such as on-chip resistor $R_Z$ 110 have more variation than external resistors such as external resistor $R_{EXT}$ 122, so more error is potentially introduced to the frequency by adding the on-chip resistor $R_Z$ 110.

To compensate for this potential error introduced by on-chip resistor $R_Z$ 110, additional resistors $R_{ZC}$ 132A and $R_{ZC}$ 132B may be added to the circuit. Equation (3) provides the time period T for the circuit, which is the inverse of the frequency:

$$T=2C[(V_{REFCOMP}/mV_{REFAMP}) \times (R_Z+R_{EXT})-R_{ZC}] \quad (3)$$

The dependency on on-chip resistor $R_Z$ 110 can therefore be compensated by choosing appropriate values for Equation (4):

$$(R_{ZC}/R_Z)=(V_{REFCOMP}/mV_{REFAMP}) \quad (4)$$

The values of m, $V_{REFCOMP}$, and $V_{REFAMP}$ are known, and the values of resistors 132 and on-chip resistor $R_Z$ 110 may be chosen in the proper ratio so the contribution of $R_Z$ to the frequency variation vanishes. The result is Equation (5):

$$T=2C[(V_{REFCOMP}/mV_{REFAMP}) \times (R_{EXT})] \quad (5)$$

In one example, on-chip resistor $R_Z$ 110 and resistor $R_{ZC}$ 132 are the same type of on-chip resistor, which provides compensation across process, voltage, and temperature (PVT). This solution is shown in FIG. 1. On-chip resistor $R_Z$ 110 and resistor $R_{ZC}$ 132 are added to system 100 to manage the problems described above. With these additions, an accurate oscillator with an external resistor may be provided.

Figure 2A:
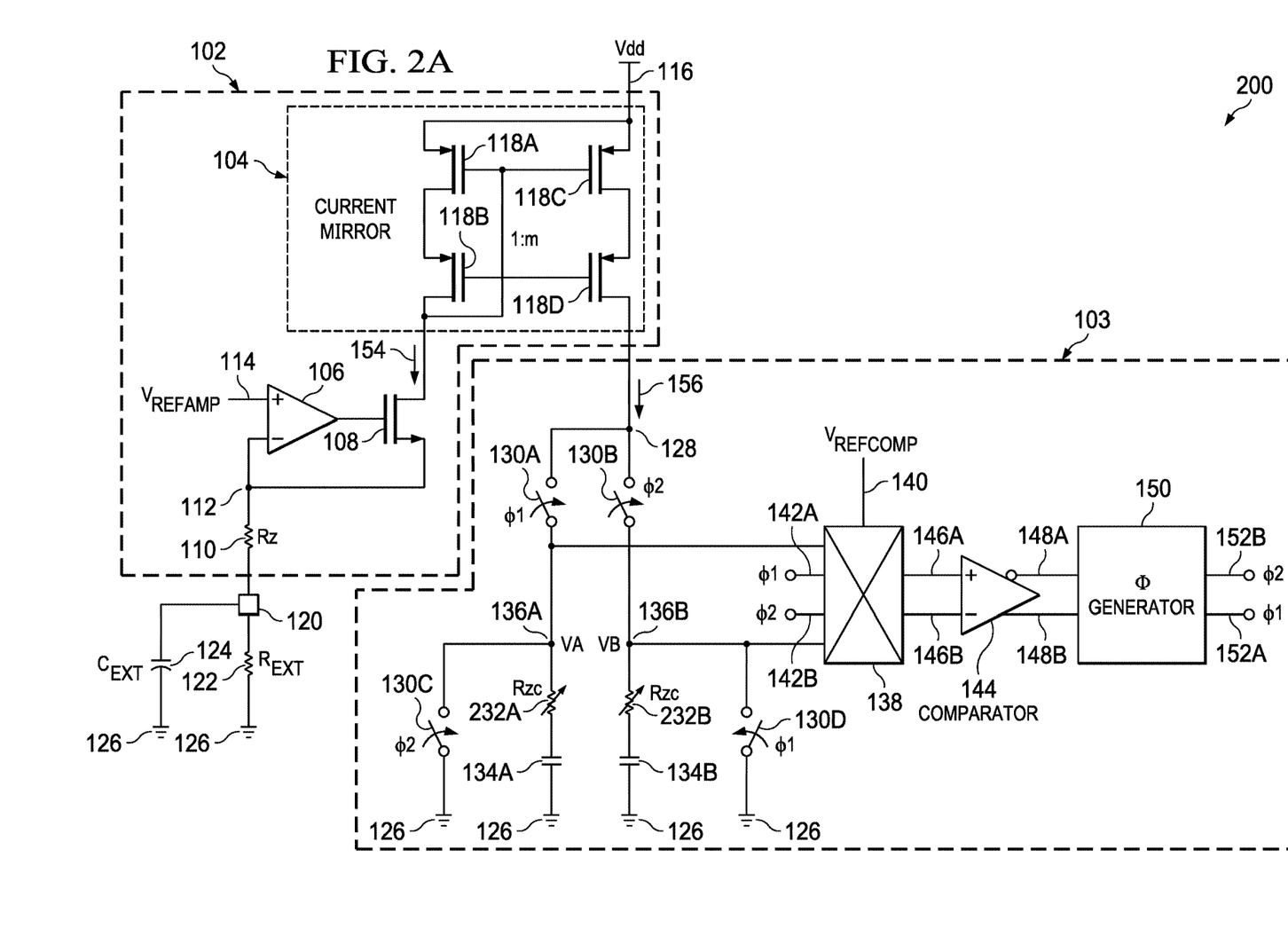
FIG. 2A is a circuit diagram of a system for an oscillator with external resistor in accordance with various examples.

FIG. 2A is a circuit diagram of a system 200 for an oscillator with external resistor in accordance with various examples herein. In FIG. 2A, the same reference numbers or other reference designators are used as in FIG. 1 to designate the same or similar (functionally and/or structurally) features. The structure and operation of many of the components of system 200 are described above with respect to FIG. 1, so a detailed explanation of the components of system 200 is omitted for simplicity. System 200 includes resistors $R_{ZC}$ 232A and $R_{ZC}$ 232B (collectively, resistors 232). Resistors 232 are variable resistors in this example that replace resistors 132 in system 100. The purpose of using variable resistors 232 in place of resistors 132 in system 100 is described below.

In systems 100 and 200, the circuit components are susceptible to process variations, and some components may be stronger or weaker than designed. Variations in the circuit components may be trimmed out using a trimming circuit in some examples. For example, for capacitors 134 in the oscillator portion of system 200, a parallel capacitor band may be included, with capacitors trimmed out as needed to compensate for the process variations. The $V_{REFAMP}$ voltage or the current mirror ratio m may also be trimmed in some examples. The $V_{REFAMP}$ voltage may be trimmed using a resistor ladder in one example. For the current mirror ratio m, more transistors 118 may be placed in the current mirror 104 structure and connected or disconnected as needed.

In one example, $V_{REFAMP}$ is trimmed. However, if the value of $V_{REFAMP}$ is changed, the ratio in Equation (4) above changes as well. $R_{ZC}/R_Z$ should be the same ratio as $V_{REFCOMP}/MV_{REFAMP}$. If $V_{REFAMP}$ is changed, the resistor ratio $R_{ZC}/R_Z$ should be changed in the same way, to satisfy Equation (4).

Figure 2B:
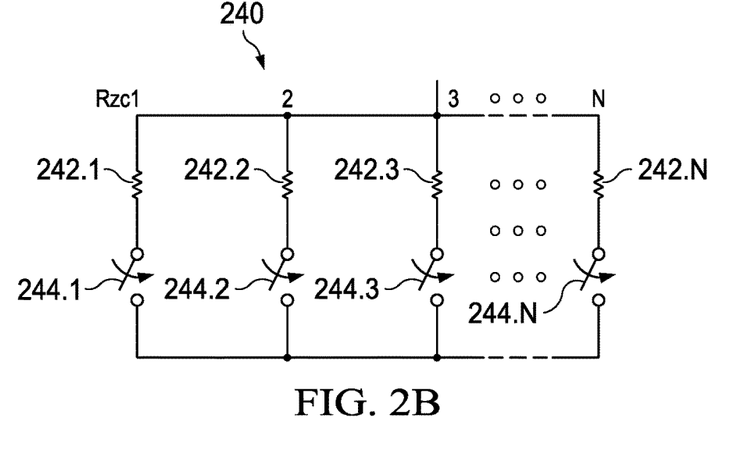
FIG. 2B is a circuit diagram of a resistor bank in accordance with various examples.
Figure 2C:
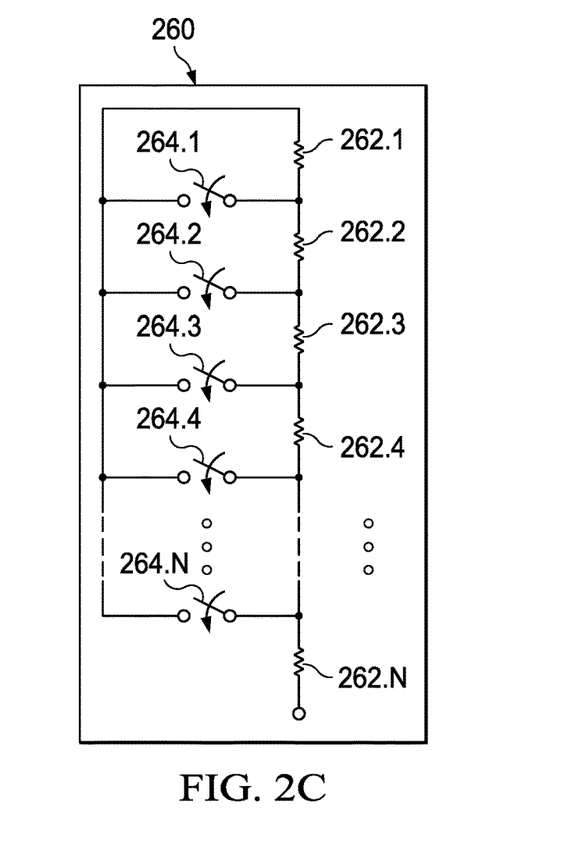
FIG. 2C is a circuit diagram of a resistor bank in accordance with various examples.

System 200 provides a solution to trimming $V_{REFAMP}$ by making resistors 232 variable resistors. One technique for making resistors 232 variable is to use a resistor bank. FIGS. 2B and 2C are examples of resistor banks in accordance with various examples herein. FIG. 2B includes resistor bank 240. Resistor bank 240 includes a series of resistors 242.1, 242.2, 242.3, . . . 242.N (collectively, resistors 242) and a series of switches 244.1, 244.2, 244.3, . . . 244.N (collectively, switches 244), with one switch 244 coupled to each resistor 242. The appropriate switch or switches 244 may be closed to provide the proper trimmed value for resistor $R_{ZC}$ 232 in system 200. The trimmed value may be selected to satisfy Equation (4).

FIG. 2C is another example resistor bank 260 in accordance with various examples herein. Resistor bank 260 includes a series of resistors 262.1, 262.2, 262.3, 262.4, . . . 262.N (collectively, resistors 262) and a series of switches 264.1, 264.2, 264.3, 264.4, . . . 264.N (collectively, switches 264), with switches 264 coupled to resistors 262 as shown. The appropriate switch 264 may be closed to provide the proper trimmed value for resistor $R_{ZC}$ 232 in system 200. The trimmed value may be selected to satisfy Equation (4). In some examples herein, the resistance of the switch (e.g., switch 264) should be considered as well when performing the trimming. In some examples, the resistance of the switch should be smaller than the resistances in the resistor bank (e.g., resistor bank 240, 260) for proper trimming and operation.

In some examples, on-chip resistor $R_Z$ 110 could be trimmed instead of $R_{ZC}$ 232 to maintain the proper ratio to satisfy Equation (4). However, as described above, on-chip resistor $R_Z$ 110 provides loop stability to counter the stability problems that may be introduced by external capacitor $C_{EXT}$ 124. Therefore, it may be more useful to trim resistor $R_{ZC}$ 232 rather than on-chip resistor $R_Z$ 110 in some examples.

Figure 3:
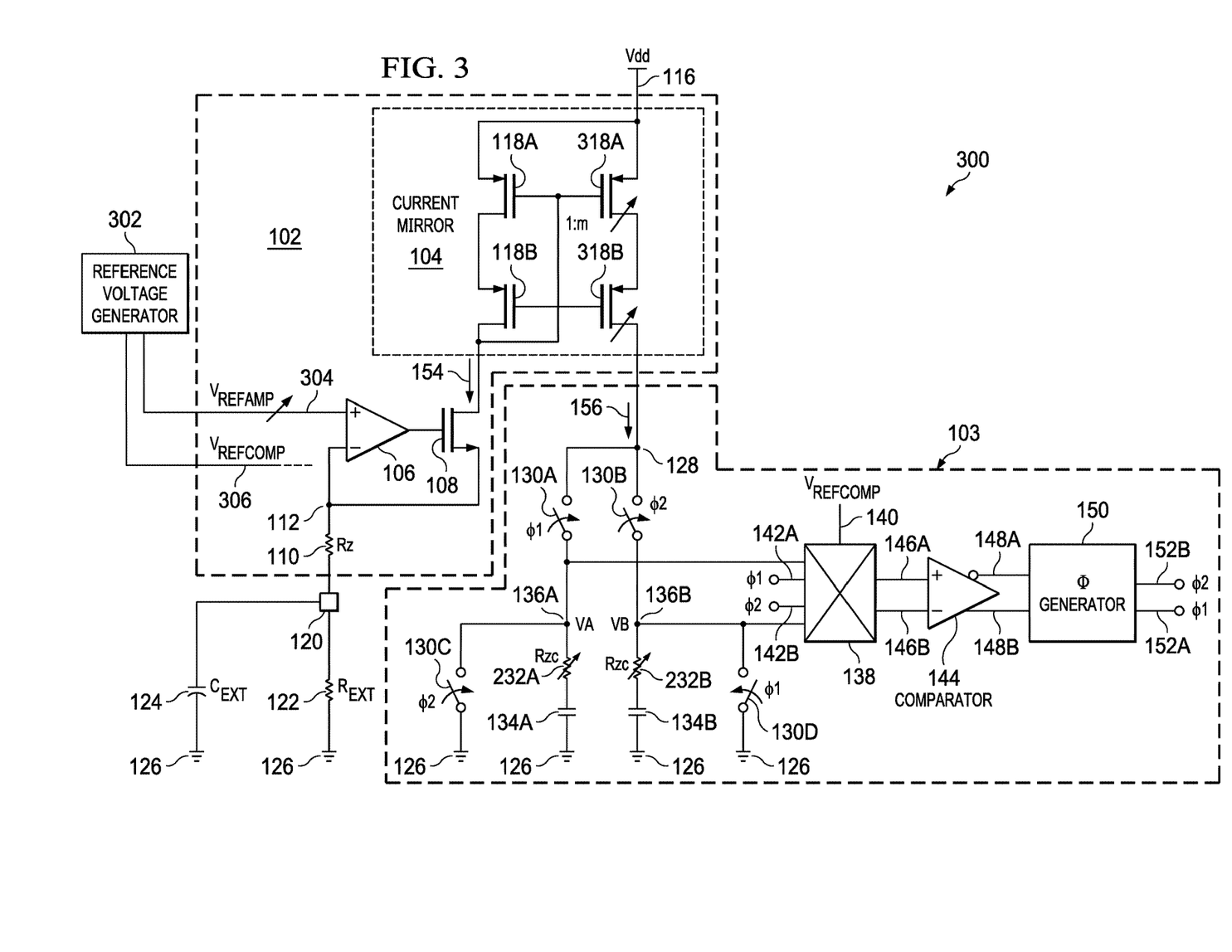
FIG. 3 is a circuit diagram of a system for an oscillator with external resistor in accordance with various examples.

FIG. 3 is a circuit diagram of a system 300 for an oscillator with external resistor in accordance with various examples herein. In FIG. 3, the same reference numbers or other reference designators are used as in FIGS. 1 and 2 to designate the same or similar (functionally and/or structurally) features. The structure and operation of many of the components of system 300 are described above with respect to FIGS. 1 and 2, so a detailed explanation of the components of system 300 is omitted for simplicity. System 300 includes a reference voltage generator 302, which has a first output 304 that produces the $V_{REFAMP}$ voltage and a second output 306 that produces the $V_{REFCOMP}$ voltage. System 300 also includes transistors 318A and 318B (collectively, transistors 318) which represent trimmable transistors for the current mirror 104 that may be trimmed to adjust the value of m. The other components of system 300 are described above with respect to FIGS. 1 and 2.

System 300 provides another example for trimming the oscillator to compensate for process variations. In system 300, the current mirror 104 ratio m may be trimmed Current mirror 104 may include banks of transistors 318. Two transistors 318 are shown in system 300, but other pairs of transistors 318 may be coupled in parallel to transistors 318A and 318B in current mirror 104. The pairs of transistors 318 may be trimmed in or out to adjust the value of m. In one example, if the trim requirement is low, the total trim may be handled by adjusting the value of m for current mirror 104.

In some examples, performing a relatively larger trim by trimming m may include allocating a large amount of circuit area for the bank of transistors 318. In this example, a first-pass crude trim may be performed on the value of m. Then, a second-pass finer trim may be performed on $V_{REFAMP}$ and/or $R_{ZC}$. By using multiple components for trimming, circuit area may be reduced in some examples. Also, a finer trim may be accomplished in some examples by trimming multiple components.

Figure 4:
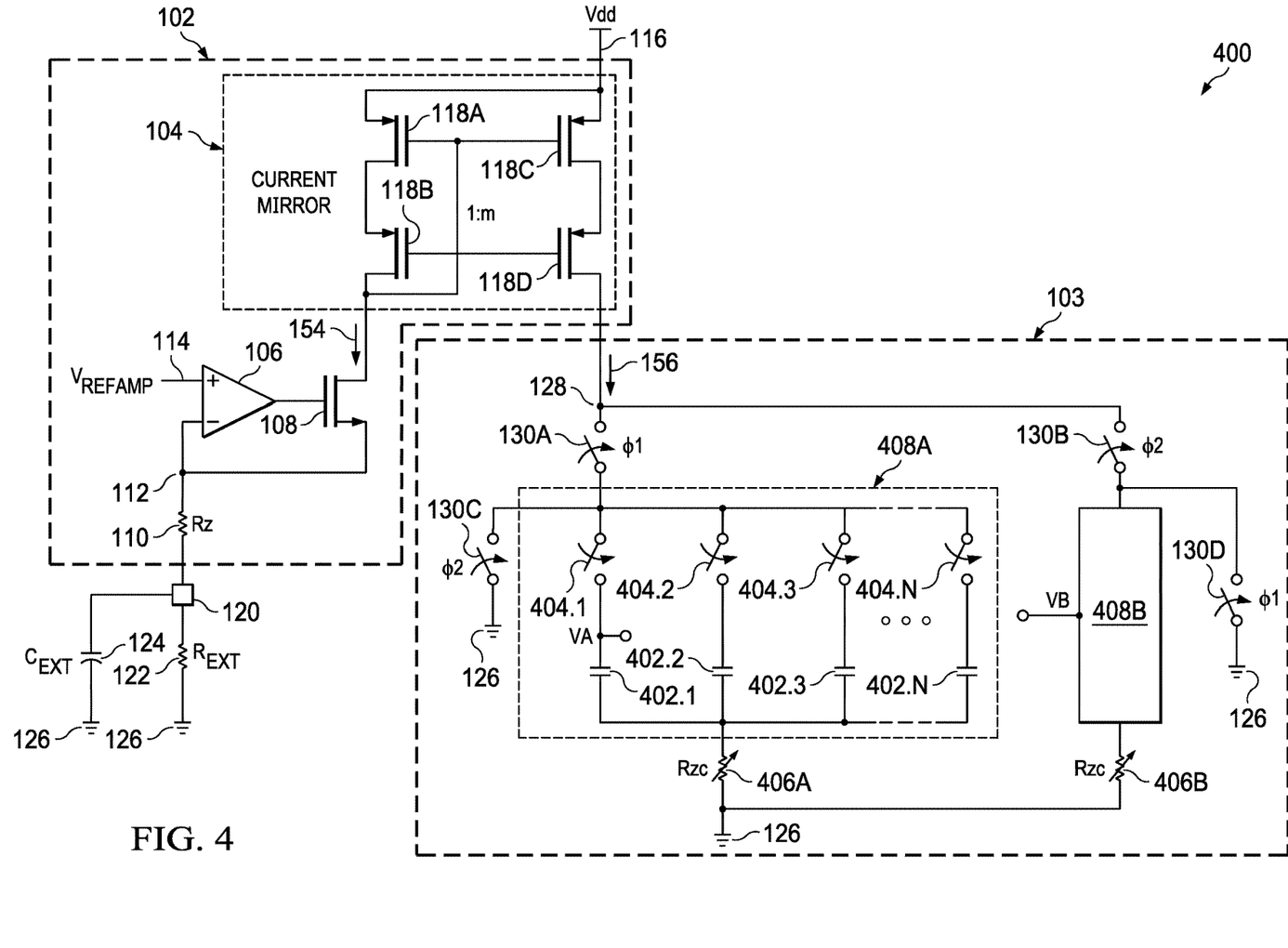
FIG. 4 is a circuit diagram of a system for an oscillator with external resistor in accordance with various examples.

FIG. 4 is a circuit diagram of a system 400 for an oscillator with external resistor in accordance with various examples herein. In FIG. 4, the same reference numbers or other reference designators are used as in FIGS. 1 and 2 to designate the same or similar (functionally and/or structurally) features. The structure and operation of many of the components of system 400 are described above with respect to FIGS. 1 and 2, so a detailed explanation of the components of system 400 is omitted for simplicity. System 400 includes a series of capacitors 402.1, 402.2, 402.3, . . . 402.N (collectively, capacitors 402) and a series of switches 404.1, 404.2, 404.3, . . . 404.N (collectively, switches 404), with switches 404 coupled to capacitors 402 as shown. System 400 also includes resistors $R_{ZC}$ 406A and 406B, and capacitor arrays 408A and 408B. In this example, capacitors 402 and switches 404 make up capacitor array 408A. Capacitor array 408B has a similar structure of capacitors and switches as capacitor array 408A, but the details of capacitor array 408B are omitted for simplicity. Capacitor array 408A is coupled to node VA 136A and capacitor array 408B is coupled to node VB 136B. Nodes VA 136A and VB 136B are coupled to block 138 as shown in FIG. 1. Block 138, comparator 144, and phase generator 150 in FIG. 1 are also components of system 400, but are omitted from FIG. 4 for simplicity.

System 400 shows that trimming may be performed on capacitors 402 in some examples. Capacitors 402 within capacitor array 408A and capacitor array 408B may both be trimmed in some examples. As shown in Equation (3) above, the time period T depends on the capacitance C. Therefore, to adjust the time period T (and the frequency), C may be trimmed. In some examples, the capacitance C may be trimmed rather than trimming the voltages and resistances to satisfy Equation (4). If the trim requirement is relatively small, the entire trim may be performed on the capacitors 402 in some examples. However, performing a relatively large trim on the capacitors 402 may require large and complex capacitor arrays 408A and 408B. In that case, a partial trim may be performed on the capacitors 402, with additional trimming performed on the current mirror ratio m, the voltage $V_{REFAMP}$, and/or the resistors $R_{ZC}$ 406A and 406B.

In any of the examples discussed herein, trimming may be performed on either one circuit component or a combination of circuit components to help correct for process variations. In some examples, the system may have a large trim range, such as plus or minus 20%. To achieve a trimming precision of 0.1%, 200 trim levels are needed. The 200 trim levels could be implemented in one component or across multiple components. The selection of the trimmed components may be controlled by a digital control signal or by any suitable trim circuitry.

Figure 5:
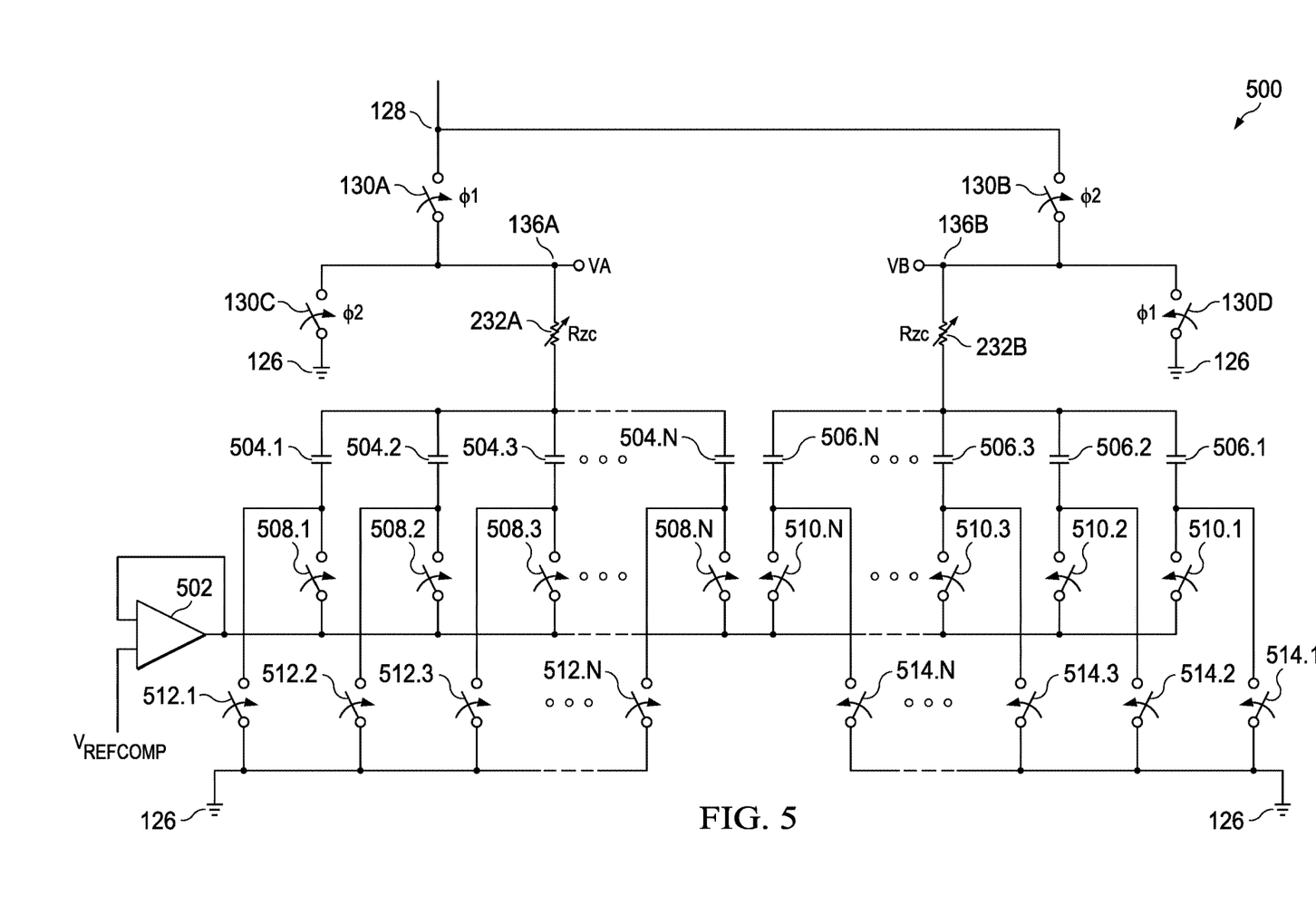
FIG. 5 is a circuit diagram of a system for a capacitor switching architecture in accordance with various examples.

FIG. 5 is a circuit diagram of a system 500 for a capacitor switching architecture in accordance with various examples herein. In FIG. 5, the same reference numbers or other reference designators are used as in FIGS. 1 and 2 to designate the same or similar (functionally and/or structurally) features. The structure and operation of many of the components of system 500 are described above with respect to FIGS. 1 and 2, so a detailed explanation of the components of system 500 is omitted for simplicity.

System 500 provides an example of a charge-coupled capacitor and switching circuit for a crude capacitor trim. If the trim requirement is low, the entire trim may be performed entirely with the capacitor in system 500, and trim using resistors $R_{ZC}$ 232A and $R_{ZC}$ 232B may not be useful. This system 500 uses low-resistance switches and a buffer to provide switching current for the capacitor array. The selection of the trimmed capacitors (504, 506) using the switches (508, 510, 512, 514) may be controlled by a digital control signal or by any suitable trim circuitry.

System 500 includes buffer 502, capacitors 504.1, 504.2, 504.3, . . . 504.N (collectively, capacitors 504), and capacitors 506.1, 506.2, 506.3, . . . 506.N (collectively, capacitors 506). System 500 also includes switches 508.1, 508.2, 508.3, . . . 508.N (collectively, switches 508), switches 510.1, 510.2, 510.3, . . . 510.N (collectively, switches 510), switches 512.1, 512.2, 512.3, . . . 512.N (collectively, switches 512), and switches 514.1, 514.2, 514.3, . . . 514.N (collectively, switches 514). The $V_{REFCOMP}$ voltage is provided to the capacitor architecture through buffer 502. Switches 508, 510, 512, and 514 are activated to select the appropriate capacitors 504 and 506 for a given trim level.

Figure 6:
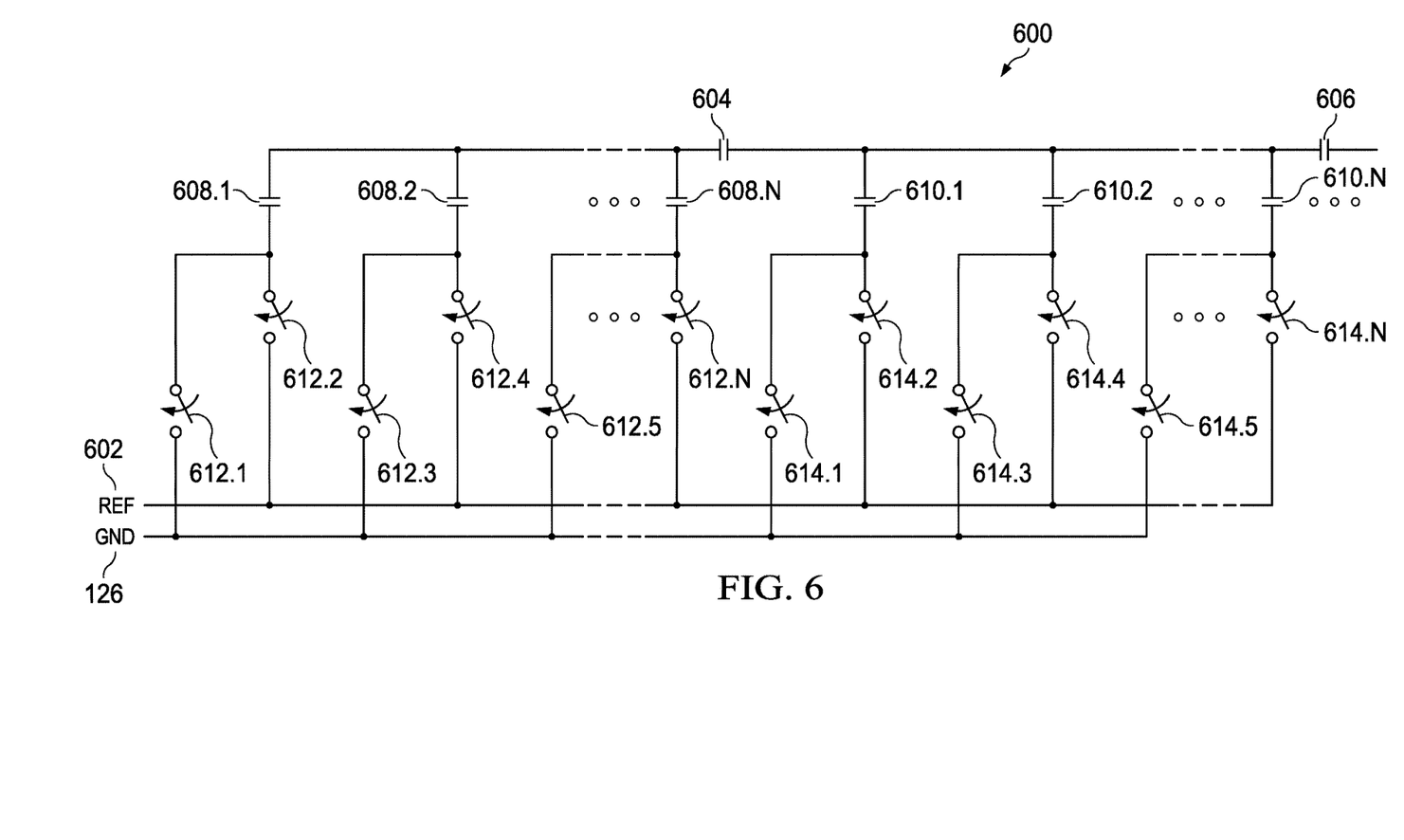
FIG. 6 is a circuit diagram of a system for a capacitor switching architecture in accordance with various examples.

FIG. 6 is a circuit diagram of a system 600 for a capacitor switching architecture in accordance with various examples herein. In FIG. 6, the same reference numbers or other reference designators are used as in FIG. 1 to designate the same or similar (functionally and/or structurally) features.

System 600 provides an example of a bridge-capacitor based capacitor array. System 600 may be useful for a large trim range, such as more than ten trim bits. In some examples, the entire trim may be performed entirely with the capacitors in system 600, and trim using resistors $R_{ZC}$ 232A and $R_{ZC}$ 232B may not be useful. System 600 includes a reference voltage 602, and capacitors 604 and 606. System 600 also includes capacitors 608.1, 608.2, . . . 608.N (collectively, capacitors 608), and capacitors 610.1, 610.2, . . . 610.N (collectively, capacitors 610). System 600 includes switches 612.1, 612.2, . . . 612.N (collectively, switches 612) and switches 614.1, 614.2, . . . 614.N (collectively, switches 614). The selection of the trimmed capacitors (608, 610) using the switches (612, 614) may be controlled by a digital control signal or by any suitable trim circuitry.

The capacitor arrays in FIGS. 5 and 6 may also be useful as crude trim arrays alongside a $V_{REFAMP}$ fine trim. In some examples, different combinations of capacitor trim, m trim, and $V_{REFAMP}$ trim may be adopted with $R_{ZC}$ trim as described herein.

Figure 7:
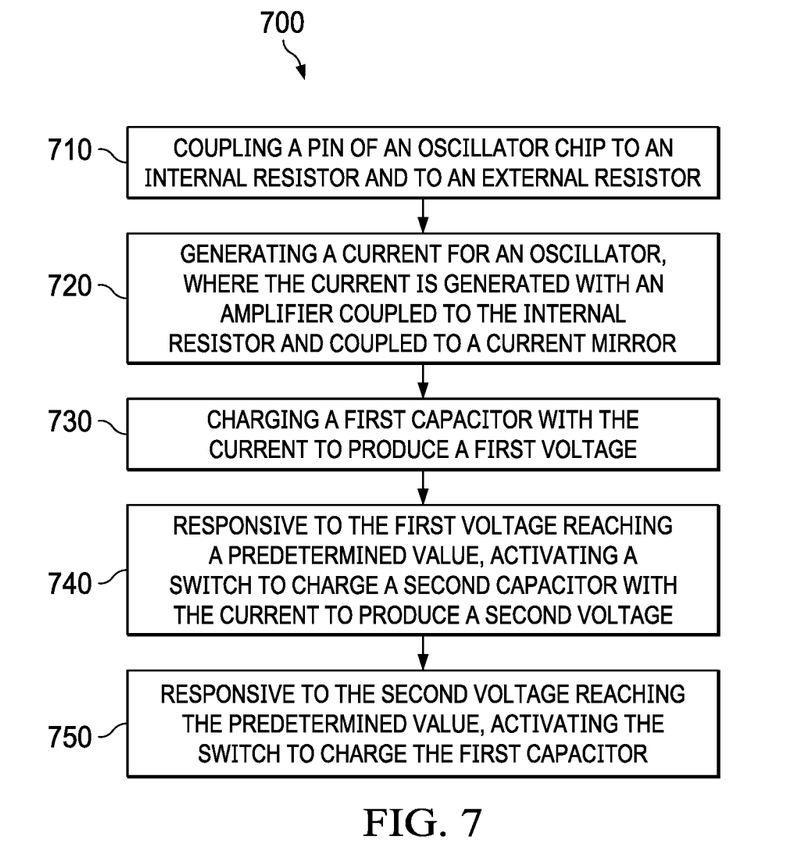
FIG. 7 is a flow diagram of a method for producing an oscillating waveform in accordance with various examples.

FIG. 7 is a flow diagram of a method 700 for producing an oscillating waveform in accordance with various examples herein. The steps of method 700 may be performed in any suitable order. The hardware components described above with respect to FIGS. 1-6 may perform method 700 in some examples.

Method 700 begins at 710, where a pin of an oscillator chip is coupled to an internal resistor and to an external resistor. The pin may be a pin such as node 120 in one example. The internal resistor may be on-chip resistor $R_Z$ 110 and the external resistor may be external resistor $R_{EXT}$ 122 in one example. An oscillator chip with an external resistor may be more accurate than an oscillator chip with only an internal resistor.

Method 700 continues at 720, where a current generator generates a current for an oscillator, where the current is generated with an amplifier coupled to the internal resistor and coupled to a current mirror. The current generator may be current generator 102 in one example A current 156 is generated with amplifier 106 and current mirror 104 as described above.

Method 700 continues at 730, where the current charges a first capacitor to produce a first voltage. In one example, node VB 136B charges via capacitor 134B. The first voltage at node VB 136B is provided to block 138, which selects the appropriate inputs to provide to comparator 144.

Method 700 continues at 740, where responsive to the first voltage reaching a predetermined value, activating a switch to charge a second capacitor with the current to produce a second voltage. In an example, the predetermined value is $V_{REFCOMP}$, which is a voltage value provided to comparator 144 via block 138. The switch may be switch 130A in this example. If switch 130A closes, capacitor 134A begins charging. The second voltage is produced at node VA 136A. In other examples, multiple switches may be activated or deactivated to provide the described functionality.

Method 700 continues at 750, where responsive to the second voltage reaching the predetermined value, the switch is activated to charge the first capacitor. The switch is activated via phase generator 150 toggling its outputs 152A and 152B responsive to the output of comparator 144 toggling its output. The output of comparator 144 is toggled after either the first voltage or the second voltage reaches the predetermined value $V_{REFCOMP}$. The process continues with the switches switching back and forth, causing the voltages at nodes VA 136A and VB 136B to charge and discharge and produce an oscillating signal.

In examples herein, an external resistor $R_{EXT}$ 122 is coupled to a pin of an oscillator chip to provide increased accuracy of the oscillator frequency. Also, a first on-chip resistor $R_Z$ 110 is coupled to the external resistor $R_{EXT}$ 122 and to an external capacitor $C_{EXT}$ 124 to provide stability. Additional internal resistors (resistors 132) may be added to the oscillator circuitry 103 to compensate for the effect of the first on-chip resistor $R_Z$ 110. The additional internal resistors 132 may be sized appropriately to compensate for the first on-chip resistor $R_Z$ 110 as described above. Also, in some examples, various oscillator components may be trimmed to correct for frequency errors across temperature and process variations. Reference voltages, internal resistor values, capacitor values, and/or current mirrors may be trimmed in various examples herein to correct for frequency errors.

The term "couple" is used throughout the specification. The term may cover connections, communications, or signal paths that enable a functional relationship consistent with this description. For example, if device A generates a signal to control device B to perform an action, in a first example device A is coupled to device B, or in a second example device A is coupled to device B through intervening component C if intervening component C does not substantially alter the functional relationship between device A and device B such that device B is controlled by device A via the control signal generated by device A.

A device that is "configured to" perform a task or function may be configured (e.g., programmed and/or hardwired) at a time of manufacturing by a manufacturer to perform the function and/or may be configurable (or re-configurable) by a user after manufacturing to perform the function and/or other additional or alternative functions. The configuring may be through firmware and/or software programming of the device, through a construction and/or layout of hardware components and interconnections of the device, or a combination thereof.

A circuit or device that is described herein as including certain components may instead be adapted to be coupled to those components to form the described circuitry or device. For example, a structure described as including one or more semiconductor elements (such as transistors), one or more passive elements (such as resistors, capacitors, and/or inductors), and/or one or more sources (such as voltage and/or current sources) may instead include only the semiconductor elements within a single physical device (e.g., a semiconductor die and/or integrated circuit (IC) package) and may be adapted to be coupled to at least some of the passive elements and/or the sources to form the described structure either at a time of manufacture or after a time of manufacture, for example, by an end-user and/or a third-party.

Circuits described herein are reconfigurable to include the replaced components to provide functionality at least partially similar to functionality available prior to the component replacement. Components shown as resistors, unless otherwise stated, are generally representative of any one or more elements coupled in series and/or parallel to provide an amount of impedance represented by the shown resistor. For example, a resistor or capacitor shown and described herein as a single component may instead be multiple resistors or capacitors, respectively, coupled in parallel between the same nodes. For example, a resistor or capacitor shown and described herein as a single component may instead be multiple resistors or capacitors, respectively, coupled in series between the same two nodes as the single resistor or capacitor.

Uses of the phrase "ground" in the foregoing description include a chassis ground, an Earth ground, a floating ground, a virtual ground, a digital ground, a common ground, and/or any other form of ground connection applicable to, or suitable for, the teachings of this description. Unless otherwise stated, "about," "approximately," or "substantially" preceding a value means +/−10 percent of the stated value. Modifications are possible in the described examples, and other examples are possible within the scope of the claims.

What is claimed is:

1. A device comprising:
    an integrated circuit chip that includes:
        a pin;
        a current mirror that includes a first output and a second output;
        a transistor coupled to the first output of the current mirror;
        a first resistor coupled between the transistor and the pin;
        a first switch coupled between the second output of the current mirror and a node;
        a second switch coupled between the node and a ground node;
        a variable resistor coupled to the node;
        a capacitor coupled between the variable resistor and the ground node;
        a comparator coupled to the node;
        a phase generator coupled to the comparator that includes:
            a first output configured to provide a first phase signal; and
            a second output configured to provide a second phase signal; and a selection circuit that includes:
  a first input coupled to the node;
  a second input coupled to the first output of the phase generator; and
  a third input coupled to the second output of the phase generator.

2. The device of claim 1, wherein:
the first switch is configured to close based on the first phase signal; and
the second switch is configured to close based on the second phase signal.

3. The device of claim 1, wherein the integrated circuit chip further includes an amplifier that includes:
a first input;
a second input coupled to the first resistor; and
an output coupled to a gate of the transistor.

4. The device of claim 3 further comprising a reference voltage generator circuit coupled to the first input of the amplifier.

5. The device of claim 1, wherein:
the node is a first node;
the variable resistor is a first variable resistor;
the capacitor is a first capacitor; and
the integrated circuit chip further includes:
  a third switch coupled between the second output of the current mirror and a second node;
  a fourth switch coupled between the second node and the ground node;
  a second variable resistor coupled to the second node; and
  a second capacitor coupled between the second variable resistor and the ground node.

6. The device of claim 5, wherein:
the first switch and the fourth switch are configured to close based on a first signal; and
the second switch and the third switch are configured to close based on a second signal.

7. The device of claim 1, wherein:
the transistor is a first transistor; and
the current mirror includes:
  a second transistor that includes a gate;
  a third transistor that includes a gate, wherein the second transistor and the third transistor are coupled in series between a voltage source and the first output of the current mirror;
  a fourth transistor that includes a gate coupled to the gate of the second transistor; and
  a fifth transistor that includes a gate coupled to the gate of the third transistor, wherein the fourth transistor and the fifth transistor are coupled in series between the voltage source and the second output of the current mirror.

8. A device comprising:
an integrated circuit chip that includes:
  a pin;
  a current mirror that includes a first output and a second output;
  a transistor coupled to the first output of the current mirror;
  a first resistor coupled between the transistor and the pin;
  a first switch coupled between the second output of the current mirror and a node;
  a second switch coupled between the node and a ground node;
  a variable resistor coupled to the node; and
  a first capacitor coupled between the variable resistor and the ground node; and
a second resistor coupled to the pin; and
a second capacitor coupled to the pin in parallel with the second resistor, wherein the second resistor and the second capacitor are external to the integrated circuit chip.

9. The device of claim 8, wherein the integrated circuit chip further includes an amplifier that includes:
a first input;
a second input coupled to the first resistor; and
an output coupled to a gate of the transistor.

10. The device of claim 9 further comprising a reference voltage generator circuit coupled to the first input of the amplifier.

11. A system comprising:
a current mirror that includes a first output and a second output;
a transistor coupled to the first output of the current mirror;
a first resistor coupled to the transistor;
a second resistor that is distinct from the first resistor coupled between the first resistor and a ground;
a capacitor coupled between the first resistor and the ground in parallel with the second resistor;
a first switch coupled to the second output of the current mirror;
a second switch coupled between the first switch and the ground;
a third resistor coupled to the first switch; and
a second capacitor coupled between the third resistor and the ground.

12. The system of claim 11, wherein the third resistor is a variable resistor.

13. The system of claim 11 further comprising:
a comparator coupled to the first switch; and
a phase generator coupled to the comparator that includes:
  a first output configured to provide a first phase signal; and
  a second output configured to provide a second phase signal.

14. The system of claim 13, wherein:
the first switch is configured to operate based on the first phase signal; and
the second switch is configured to operate based on the second phase signal.

15. The system of claim 13 further comprising a selection circuit that includes:
a first input coupled to the first switch;
a second input coupled to the first output of the phase generator; and
a third input coupled to the second output of the phase generator.

16. The system of claim 11 further comprising an amplifier that includes:
a first input;
a second input coupled to the first resistor; and
an output coupled to a gate of the transistor.

17. The system of claim 16 further comprising a reference voltage generator circuit coupled to the first input of the amplifier.

18. The system of claim 11, wherein:
the capacitor is a first capacitor; and
the system further comprises:
  a third switch coupled to the second output of the current mirror;

a fourth switch coupled between the third switch and the ground;
a fourth resistor coupled to the third switch; and
a third capacitor coupled between the fourth resistor and the ground.

19. The system of claim 18, wherein:
the first switch and the fourth switch are configured to operate based on a first signal; and
the second switch and the third switch are configured to operate based on a second signal.

20. The system of claim 11 further comprising a pin coupled between the first resistor and the second resistor.

* * * * *